May 21, 1963 J. A. TORRENCE 3,090,932

TUNER WITH SINGLE KNOB CLUTCHABLE TO EITHER TURRET OR INDIVIDUAL CHANNEL VERNIERS

Filed Dec. 4, 1961 3 Sheets-Sheet 1

INVENTOR.

James A. Torrence

BY Mueller & Aichele

Attys.

INVENTOR.
James A. Torrence
BY Mueller & Aichele
Attys.

INVENTOR.
James A. Torrence
BY Mueller & Aichele
Attys.

United States Patent Office 3,090,932
Patented May 21, 1963

3,090,932
TUNER WITH SINGLE KNOB CLUTCHABLE TO EITHER TURRET OR INDIVIDUAL CHANNEL VERNIERS

James A. Torrence, Franklin Park, Ill., assignor to Motorola, Inc., Chicago, Ill., a corporation of Illinois
Filed Dec. 4, 1961, Ser. No. 156,914
6 Claims. (Cl. 334—51)

This invention relates generally to tuners for television receivers, and more particularly to a receiver tuning device with fine tuning which may be preset for complete operation by a single knob.

A tuning device for a television receiver which is capable of preset fine tuning requires a number of separate adjustments. For the most part, preset fine tuning is accomplished by disposing a number of fine tuning control elements around the periphery of a rotatable disc, each element representing a particular television channel. Each of these fine tuning control elements operates a variable impedance fine tuning unit and must be preset for the particular channel which it represents. Furthermore, the fine tuning control element for the desired channel must be positioned in the proper location to permit adjustment. Means must also be provided for moving the channel selection elements to the various channel positions. Simplification of all these operations is desirable, for in addition to lowering the cost of parts and the time of assembly, operation of the receiver will be made easier and the appearance of the receiver will be enhanced.

Accordingly, an object of this invention is to provide an improved tuner for a television receiver capable of preset fine tuning and which tuner is fully operable from without the receiver by one knob.

A further object of this invention is to provide a tuner for a television receiver capable of preset fine tuning in which the fine tuning control elements are actuable by positive action thereby affording maximum reliability.

Another object of this invention is to provide a tuner for a television receiver capable of preset fine tuning which tuner is easy to use, simple of construction, and low in cost.

A feature of the invention is the provision, in a television receiver tuner capable of preset fine tuning and having a rotatable control sleeve, of an improved clutch adapted to disengage a channel selection shaft during presetting of the fine tuner to allow single knob operation and which is located at the interior end of the control sleeve.

Another feature of the invention is the provision in a television tuner capable of preset fine tuning of a pin clutch located at the interior end of a rotatable sleeve for transmitting torque from a rotatable shaft to the rotatable sleeve, the clutch comprising a pin extending radially from the shaft and engageable in a slot in a gear on the sleeve.

Another feature of the invention is the provision in a television receiver tuner capable of presetting fine tuning of a gear driven channel selection shaft offset from the operating knob shaft which operating knob shaft is adapted for direct engagement with, and adjustment of, fine tuning control members.

In a particular form of the invention a television tuner is provided with two rotatable members, the first of which is adapted to operate a channel selection mechanism of the receiver, and the second of which is adapted to operate a fine tuning mechanism of the receiver and is normally disengaged therefrom. A knob actuated control sleeve is mounted concentrically with the first rotatable member and is mechanically coupled thereto by means of a clutch located within a gear attached to the interior end of the control sleeve. A spring biases the clutch into engagement. The second rotatable member has a gear thereon engaged with the gear on the end of the control sleeve so that rotation of the knob in its normal position will cause rotation of the control sleeve and both rotatable members for channel selection. Depression of the knob against the spring causes disengagement of the clutch. Further depression of the knob will force the second rotatable member into engagement with the fine tuning mechanism so that rotation of the knob causes rotation of the second member to adjust the fine tuning mechanism but does not cause rotation of the first member so that the channel selection mechanism is not affected.

Figure 1:
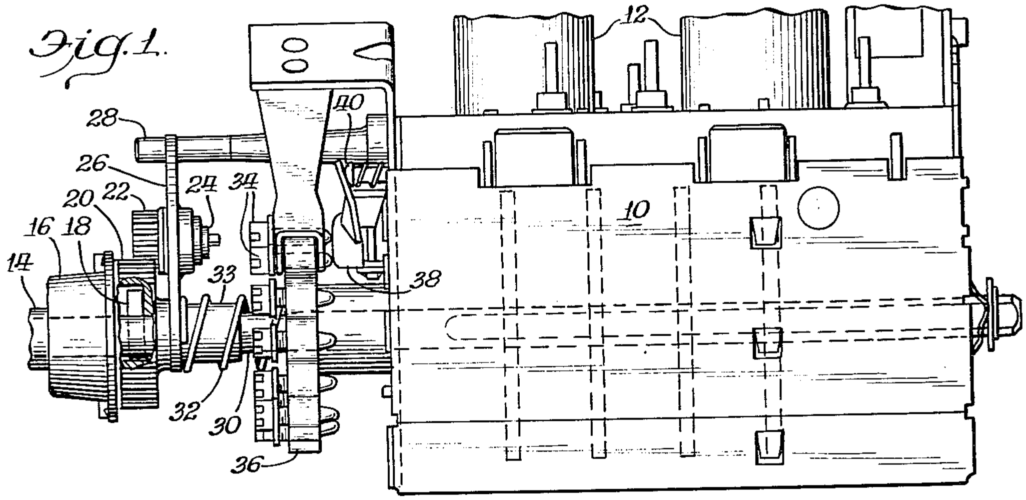
FIG. 1 is a side elevation of a tuner of the invention with the fine tuning adjustment disengaged.
Figure 2:
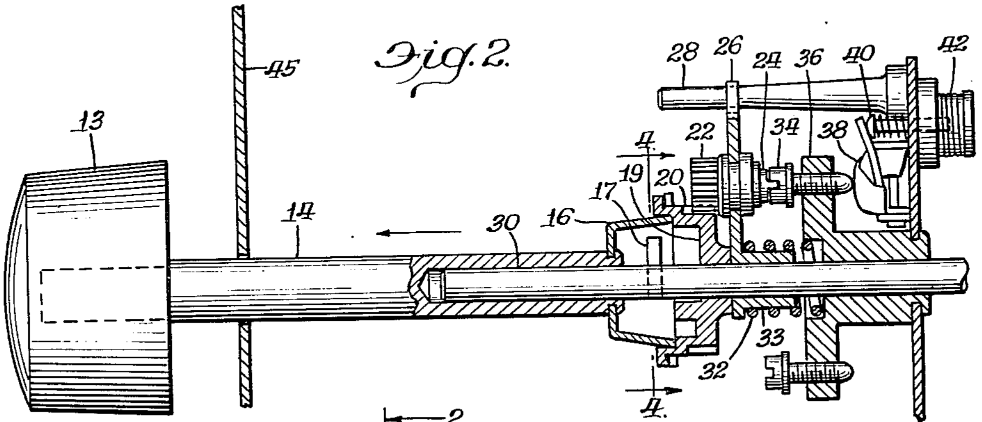
FIG. 2 is a side elevation, partly in section, with the fine tuner adjustment engaged.
Figure 3:
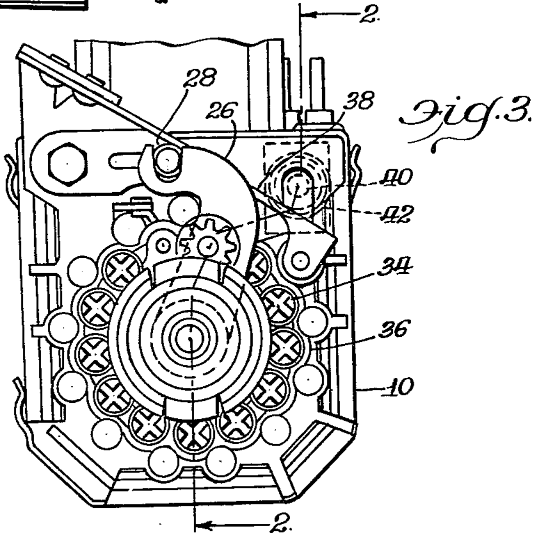
FIG. 3 is a front view of the tuner of FIG. 1.

In FIGS. 1 through 3 there is shown a tuner 10 having tube shields 12 mounted thereon to shield the usual radio frequency amplifier and mixer oscillator tubes. Sleeve 14 which is operable by knob 13 is fastened to clutch housing 16 which houses a pin clutch 18 formed by housing 16, pin 17 and slot 19. Dial plate 45 is fixed to sleeve 14 and interposed between knob 13 and the remainder of the tuner and may, for example, have channel numbers arranged thereon, one of which is visible from the outside of the receiver, to indicate to a user the channel at which the tuner is positioned. Gear 20 is fastened to housing 16 to be driven by sleeve 14. Gear 20 is in engagement with gear 22 which turns screwdriver 24. Gear 20 has a sleeve portion 33 thereon for maintaining correct alignment of gear 20, housing 16 and sleeve 14 on tuner shaft 30. Screwdriver 24 is carried on arm 26 which is fixed at one end to sleeve portion 33 and is guided at the other end by guide post 28. Tuner shaft 30 is mounted concentrically in the sleeve 14 and is driven by sleeve 14 when pin clutch 18 is in engagement.

Figure 4:
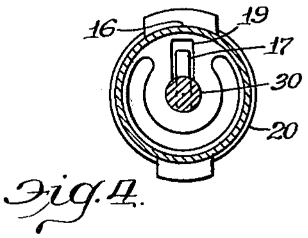
FIG. 4 is a section view along the line 4—4 of FIG. 2.

In FIG. 4 the construction of clutch 18 is more specifically shown. Pin 17 is fixed in tuner shaft 30 and is engageable with slot 19. Slot 19 is formed on the interior part of sleeve gear 20 on which clutch housing 15 is fitted. Axial movement of sleeve 14 thereby governs engagement of pin 17 in slot 19.

Pin clutch 18 is biased into engagement by spring 32. Tuner shaft 30 is adapted to govern channel selection by the tuner 10. Rotation of sleeve 14 in this position causes rotation of tuner shaft 30 thereby providing selection of a desired channel. Since clutch 18 is constructed to re-engage only in one angular position of knob 13, dial plate 45 may be re-indexed to the proper setting by turning the knob until spring 32 forces pin 17 into slot 19. Thus, tuner shaft 30 cannot be turned until dial plate 45 is properly indexed.

Referring now to FIG. 2, depression of the knob, and hence sleeve 14 against the bias of spring 32, disengages clutch 18 by moving pin 17 out of slot 19. Further depression will bring screw driver 24 into positive engagement with cam screw 34. There are a plurality of such cam screws mounted about the periphery of channel selection wheel 36 which is fixed to and operable by tuner shaft 30. (See FIG. 3.) Rotation of cam screw 34 causes movement of lever 38 mounted on the face of receiver 10, and consequent movement of fine tuning slug 40 in variable impedance element 42. Variable impedance element 42 is connected in the tuner circuit to provide fine tuning of the particular channel with which the tuner is aligned.

Figure 5:
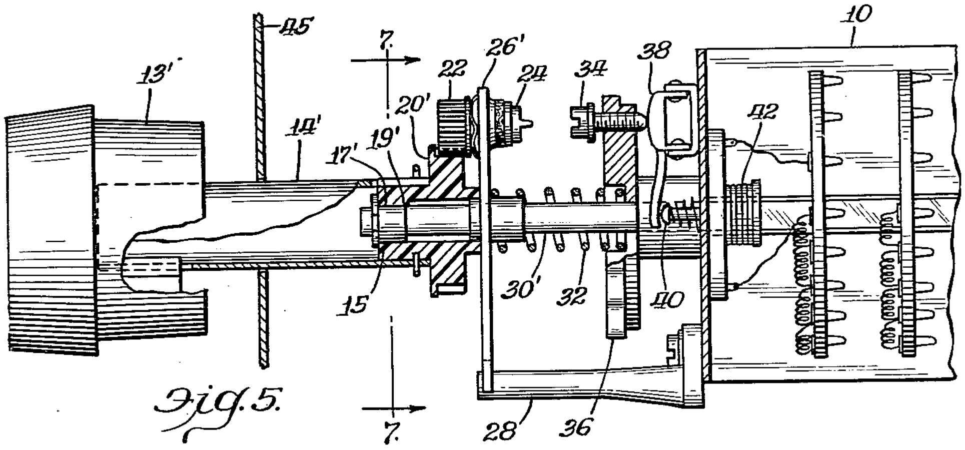
FIG. 5 is a side elevation, partly in section, of a second embodiment of the invention with the fine tuner adjustment disengaged.
Figure 6:
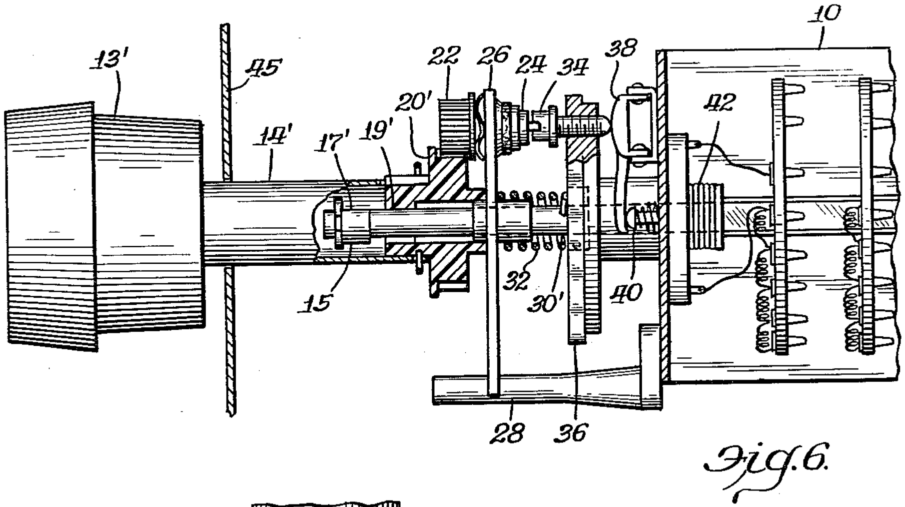
FIG. 6 is a side elevation of the tuner of FIG. 5 but with the fine tuner adjustment mechanism engaged.
Figure 7:
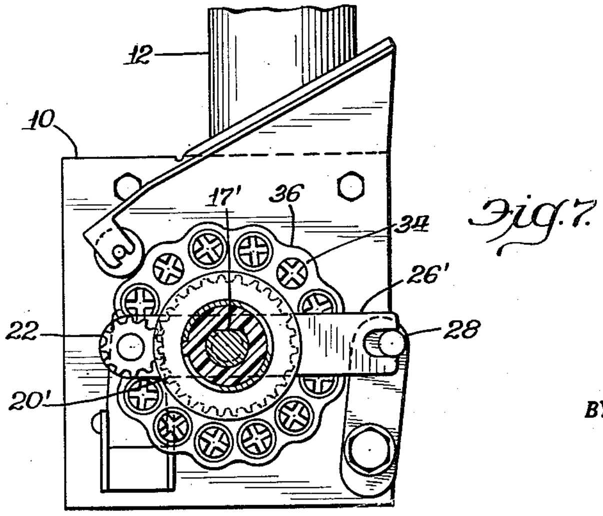
FIG. 7 is a sectional view along the line 7—7 of FIG. 5.

FIGS. 5, 6 and 7 show another embodiment of the device. Sleeve 14′ is mounted concentrically on tuner shaft 30′ and is biased outwardly thereon by spring 32. Gear 20′ is fastened to sleeve 14′ and has a bearing surface 19′ in its interior. Shaft 30′ has at the corresponding end a widened section 15 of slightly greater diameter. Widened section 15 has a flat portion 17′ thereon tangential to the outer diameter of the remainder of shaft 30′. Flat portion 17′ mates with bearing surface 19′ to provide the necessary driving means. Upon depression of sleeve 14′ by the knob, widened section 15 and hence flat portion 17′ is moved out of contact with bearing surface 19′ allowing sleeve 14′ to be fully rotatable without driving tuner shaft 30′.

It may be seen also from FIGS. 5 through 7 that the screwdriver 24 is turned by sleeve gear 20 and screwdriver gear 22 in the same manner as in the previous embodiment. However, guidepost 28 is mounted on arm 26 on the opposite side of sleeve 14′ from the screwdriver gear 22, whereas in the previous embodiment it was on the same side.

Dial 45 is positioned on sleeve 14′ between knob 13′ and the remainder of the tuner as in the first embodiment. Since engagement of the clutch arrangement of portion 14′ and surface 19′ permits only one angular position of knob 13′, re-indexing of dial 15 is accomplished in the same manner as in the previous embodiment.

Figure 8:
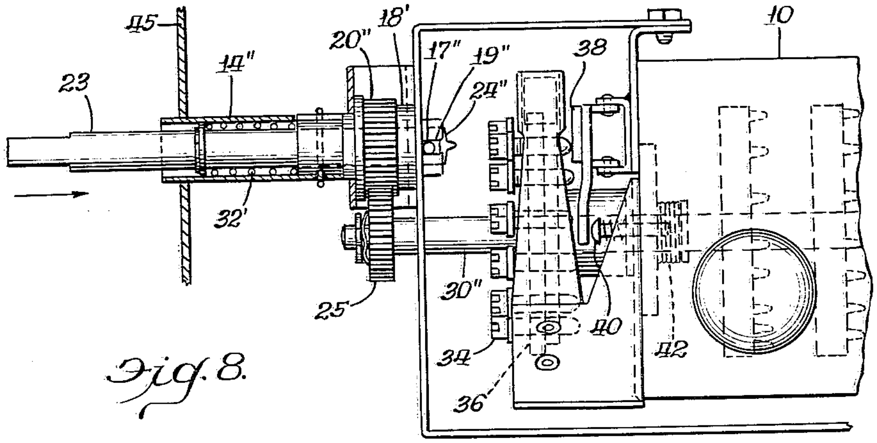
FIG. 8 is a side elevation partly in section of a third embodiment of the invention with the fine tuner adjustment disengaged.
Figures 9, 10:
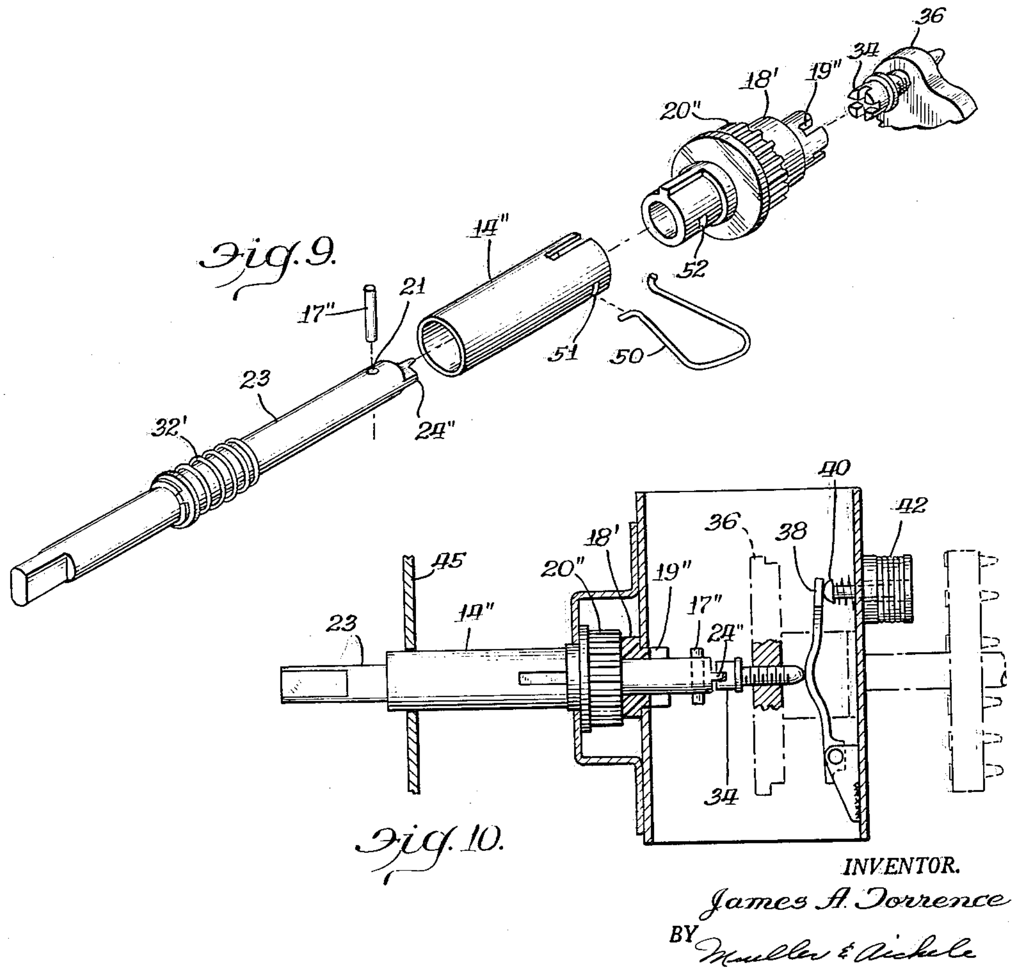
FIG. 9 is an exploded view of a portion of the tuner of FIG. 8.
FIG. 10 is a bottom view partly in section of the tuner of FIG. 8.

FIGS. 8, 9 and 10 show a third embodiment of the device. Adjusting shaft 23, which may be operated by a knob (not shown), is fitted concentrically in sleeve 4″ and biased outwardly therein by spring 32′. Sleeve 14″ and clutch member 18′ are attached to opposite sides of gear 20″. Sleeve 14″ is fixed to gear 20″ by means of U-spring 50 clipped around sleeve 14″ so that part of spring 50 is positioned in mated slots 51 and 52.

Clutch member 18′ has a plurality of slots 19″ formed in one end thereof. Pin 17″ is fitted in hole 21 on adjusting shaft 23 (see FIG. 9) and is adapted to engage one of slots 19″ thereby permitting turning of sleeve 14″ and sleeve gear 20″ by adjusting shaft 23. Gear 20″ is engaged with tuner gear 25, and tuner gear 25 in turn drives tuner shaft 30″.

As shown in FIG. 10, depression of adjusting shaft 23 by the knob causes pin 17″ to disengage from slots 19″ permitting turning of adjusting shaft 23 without transmitting torque to shaft 30″. By depressing adjusting shaft 23, screwdriver 24 may be brought into engagement with one of cams screws 34 thereby permitting fine tuning in the manner discussed in the previous embodiments. Release of pressure on the knob and hence adjusting shaft 23, and a slight turn if necessary, will cause pin 17″ to re-enter slots 19″, once again permitting turning of sleeve 14″ and shaft 30″ for channel selection.

Dial 45 is fixed to sleeve 14″ in a location similar to that of the dial in the previously described embodiments. Since the knob in this embodiment is fixed to shaft 23 and not sleeve 14″, sleeve 14″ and hence dial 45 will not turn during the fine tuning operation. Therefore, it is unnecessary to permit re-engagement of clutch member 18′ in a single angular position of the knob since operation of the knob is independent from dial 45, eliminating any need to re-index the dial after fine tuning.

Thus, the invention as disclosed in the three embodiments above described enables performance of the functions of pre-setting a fine tuner and selecting a desired channel by movement of a single knob. The fine tuning adjustment is made by positive contact with the cam screws resulting in reliable operation, while the single knob and low number of necessary parts provide an easy-to use low cost tuner adjusting mechanism.

I claim:

1. In a tuner for a television receiver having a channel selecting mechanism and a plurality of cam screws arranged for presetting a fine tuning element, the combination of a rotatable sleeve and a sleeve gear mounted thereon, two rotatable members one of which is engageable with the cam screws for adjustment thereof, and the other of which operates the channel selecting mechanism, said rotatable sleeve and sleeve gear being mounted concentrically with one of said rotatable members, a clutch located at the interior end of said rotatable sleeve to mutually engage said concentrically mounted rotatable sleeve and member, a drive gear mounted on the other of said rotatable members and in engagement with said sleeve gear, a spring biasing said clutch in engagement, and a single knob operable from without the receiver to impart torque to said rotatable sleeve and said rotatable members, said knob being depressible against said spring to disengage said clutch, said rotatable member engageable with the cam screws further being mechanically coupled to said knob so that axial force applied to said knob will be transmitted to said rotatable member engageable with the cam screws to cause engagement thereof with a cam screw to provide adjustment of the fine tuning element by turning said knob while said rotatable member which operates the channel selecting mechanism remains stationary.

2. In a tuner for a television receiver having channel selecting means and a plurality of cam screws arranged for presetting a fine tuning element, the combination of a rotatable sleeve and a sleeve gear mounted thereon, a first rotatable member engageable with the cam screws for adjustment thereof, a second rotatable member operating a channel selecting means, said rotatable sleeve and sleeve gear being mounted concentrically with said second rotatable member, a clutch located in the interior of said sleeve gear to mutually engage said concentrically mounted rotatable sleeve and second member, a drive gear mounted on said first rotatable member and in engagement with said sleeve gear, a spring biasing said clutch in engagement, and a single knob on said sleeve and operable from without the receiver to impart torque to said first and second rotatable members, said knob being depressible against said spring to disengage said clutch, said first rotatable member further being mechanically coupled to said sleeve and axially operable by force applied to said knob so that when said knob is depressed to disengage said clutch, said first rotatable member will be forced into positive engagement with the cam screws to provide adjustment thereof while said second rotatable member remains stationary.

3. In a tuner for a television receiver having channel selecting means and a plurality of cam screws for presetting a fine tuning element, the combination of a rotatable sleeve and a sleeve gear mounted thereon, a first rotatable member engageable with the cam screws for adjustment thereof, a second rotatable member operating the channel selecting means, said rotatable sleeve and sleeve gear being mounted concentrically with said first rotatable member, a clutch located on the interior end of said sleeve to mutually engage said sleeve and first member, a drive gear mounted on said second rotatable member and in engagement with said sleeve gear, a spring biasing said clutch in engagement, and a single knob on said first rotatable member and operable from without the receiver to impart torque by said first rotatable member to said rotatable sleeve and said second rotatable member, said knob being depressible against said spring to disengage said clutch, said first rotatable member further being axially operable by said knob so that when said knob is depressed to disengage said clutch, said first rotatable member will be caused to positively engage a cam screw to provide adjustment thereof while said second rotatable member remains stationary.

4. In a tuner for television receiver the combination of a rotatable control shaft for operating said tuner, a detent positioned channel selection wheel mounted on said control shaft and containing a plurality of adjustable cam screws, a variable impedance element for fine tuning the receiver and operable by each of said cam screws when said cam screws are properly positioned, a knob actuated rotatable sleeve and attached sleeve gear mounted concentrically on said control shaft, clutch means for mutually engaging said sleeve and said shaft, said clutch means consisting of a pin extending from said shaft and of a slot formed in the interior of said sleeve gear for driving said pin, a spring biasing said sleeve outwardly on said shaft so that said clutch means is held in engagement, an arm fastened to and extending from said sleeve, a guide post on the face of said tuner for guiding the free end of said arm, a driver gear mounted on said arm between said sleeve and said post and in engagement with said sleeve gear, a screwdriver driven by said driver gear and engageable with each of said cam screws so that rotation of said sleeve will cause rotation of said control shaft and said screwdriver and so that said sleeve when depressed against the bias of said spring to disengage said clutch means will cause rotation solely of said screwdriver, and so that further depression of said sleeve against the bias of said spring will bring said screwdriver into engagement with one of said cam screws for adjustment thereof.

5. In a tuner for television receiver the combination of a rotatable control shaft for operating said tuner, a detent positioned channel selection wheel mounted on said control shaft and containing a plurality of adjustable cam screws, a variable impedance element for fine tuning the receiver and operable by each of said cam screws when said cam screws are properly positioned, a knob actuated rotatable sleeve and attached sleeve gear mounted concentrically on said control shaft, clutch means for mutually engaging said sleeve and said shaft, said clutch means consisting of an enlarged portion of said shaft having a flat surface thereon and a matching recess formed in the interior of said sleeve gear for mating with said flat surface, a spring biasing said sleeve outwardly on said shaft so that said clutch means is held in engagement, an arm fastened to and extending from opposite sides of said sleeve, a guide post on the face of said tuner for guiding one free end of said arm, a driver gear mounted on the other free end of said arm and in engagement with said sleeve gear, a screwdriver driven by said driver gear and engageable with each of said cam screws so that rotation of said sleeve will cause rotation of said control shaft and said screwdriver and so that said sleeve when depressed against the bias of said spring to disengage said clutch means will cause rotation solely of said screwdriver and so that further depression of said sleeve against the bias of said spring will bring said screwdriver into engagement with one of said cam screws for adjustment thereof.

6. In a tuner for television receiver the combination of a rotatable control shaft for operating said tuner, a detent positioned channel selection wheel mounted on said control shaft and containing a plurality of adjustable cam screws, a variable impedance element for fine tuning the receiver and operable by each of said cam screws when said cam screws are properly positioned to operate a variable impedance element for fine tuning the receiver, a knob actuated rotatable adjusting shaft having screw driving means thereon, a sleeve and attached sleeve gear mounted concentrically on said adjusting shaft, clutch means for mutually engaging said sleeve and said adjusting shaft, said clutch means consisting of a pin extending from said shaft and slots formed in an end of said sleeve for driving said pin, a spring biasing said adjusting shaft outwardly in said sleeve so that said clutch means is held in engagement, a gear mounted on said control shaft and in engagement with said sleeve gear, said screwdriving means engageable with each of said cam screws so that rotation of said adjusting shaft will cause rotation of said sleeve and said control shaft and so that said adjusting shaft when depressed against the bias of said spring to disengage said clutch means will rotate only of itself and so that further depression of said sleeve against the bias of said spring will bring said screwdriver into engagement with one of said cam screws for adjustment thereof.

No references cited.